United States Patent
Kim et al.

(10) Patent No.: US 8,148,250 B2
(45) Date of Patent: Apr. 3, 2012

(54) METHOD FOR MANUFACTURING SEMICONDUCTOR DEVICE FOR PREVENTING OCCURRENCE OF SHORT CIRCUIT BETWEEN BIT LINE CONTACT PLUG AND STORAGE NODE CONTACT PLUG

(75) Inventors: Hyoung Joon Kim, Gyeonggi-do (KR); Ho Yup Kwon, Seoul (KR); Jeong Hoon Park, Gyeonggi-do (KR); Sung Hyun Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 23 days.

(21) Appl. No.: 12/914,318

(22) Filed: Oct. 28, 2010

(65) Prior Publication Data

US 2011/0045670 A1 Feb. 24, 2011

Related U.S. Application Data

(62) Division of application No. 12/467,412, filed on May 18, 2009, now Pat. No. 7,846,827.

(30) Foreign Application Priority Data

Mar. 10, 2009 (KR) ........................ 10-2009-0020097

(51) Int. Cl.
*H01L 21/44* (2006.01)
(52) U.S. Cl. .... 438/597; 438/637; 438/674; 257/21.584

(58) Field of Classification Search .................. 438/597, 438/618, 637, 642, 672, 674, 675, 700, 703, 438/742
See application file for complete search history.

(56) References Cited

U.S. PATENT DOCUMENTS

| 2004/0149992 A1 | 8/2004 | Park et al. |
| 2005/0272250 A1 | 12/2005 | Yun et al. |
| 2006/0286745 A1 | 12/2006 | Park et al. |
| 2008/0003811 A1 | 1/2008 | Lee et al. |
| 2008/0093741 A1 | 4/2008 | Lee |

FOREIGN PATENT DOCUMENTS

| KR | 1020010059019 A | 7/2001 |
| KR | 1020010063853 A | 7/2001 |
| KR | 102005005114 A | 6/2005 |
| KR | 1020070075980 A | 7/2007 |
| KR | 1020090014016 A | 2/2009 |

OTHER PUBLICATIONS

USPTO OA mailed Nov. 19, 2009 in connection with U.S. Appl. No. 12/467,412.
USPTO OA mailed Mar. 19, 2010 in connection with U.S. Appl. No. 12/467,412.
USPTO NOA mailed Jul. 15, 2010 in connection with U.S. Appl. No. 12/467,412.

*Primary Examiner* — Savitr Mulpuri
(74) *Attorney, Agent, or Firm* — Ladas & Parry LLP

(57) ABSTRACT

A method for manufacturing a semiconductor device includes the steps of forming a plug on a semiconductor substrate, forming an insulation layer over the semiconductor substrate having the plug formed thereon, defining a line type trench through a first etching of a partial thickness of the insulation layer; and defining a contact hole through a second etching of a portion of the insulation layer corresponding to the bottom of the trench so as to expose the plug.

5 Claims, 9 Drawing Sheets

METHOD FOR MANUFACTURING SEMICONDUCTOR DEVICE FOR PREVENTING OCCURRENCE OF SHORT CIRCUIT BETWEEN BIT LINE CONTACT PLUG AND STORAGE NODE CONTACT PLUG

CROSS-REFERENCE TO RELATED APPLICATIONS

The present application claims priority to Korean patent application number 10-2009-0020097 filed on Mar. 10, 2009, which is incorporated herein by reference in its entirety.

BACKGROUND OF THE INVENTION

The present invention relates generally to a method for manufacturing a semiconductor device, and more particularly, to a method for manufacturing a semiconductor device which can prevent the occurrence of a short circuit between a bit line contact plug and a storage node contact plug, thereby improving the characteristics and the reliability of a semiconductor device.

A recent design trend in semiconductor devices is increased capacity, and typically, increasing the capacity of a semiconductor device requires that a chip size be increased. However, limitations exist in increasing the size of a chip, because if the size of a chip increases, the number of chips per wafer decreases and the manufacturing yield of semiconductor devices is reduced. Recently, in order to form a number of memory cells in one wafer, efforts have been made to change a cell layout and thereby decrease the area of a cell.

As a part of these efforts, a method has been proposed, in which active regions are tilted so that a layout is changed from $8F^2$ to $6F^2$.

In the $6F^2$ layout, tilted active regions are defined in a semiconductor substrate. Word lines and bit lines are formed on the semiconductor substrate the active regions defined therein, in such a way as to extend in directions perpendicular to each other. The word lines are located such that two word lines pass through each active region, and the bit lines are located such that one bit line passes through each active region. In detail, the bit lines are located such that one bit line passes through a portion of the active region positioned between two word lines.

In the $6F^2$ layout as described above, storage node contact plugs are respectively formed in portions of each active region positioned outside the two word lines that pass therethrough, and a bit line contact plug is formed in a portion of each active region positioned between the two word lines. Therefore, in a semiconductor device having the $6F^2$ layout, since both the storage node contact plugs and the bit line contact plug can be located in the active region, the level of integration can be increased compared to a semiconductor device having the existing $8F^2$ layout.

However, in the semiconductor device having the $6F^2$ layout as described above, a short circuit can occur between the bit line contact plug and the storage node contact plugs because the storage node contact plugs and the bit line contact plug are located side by side, and as a result the characteristics and the reliability of the semiconductor device are diminished.

SUMMARY OF THE INVENTION

Embodiments of the present invention include a method for manufacturing a semiconductor device which can prevent the occurrence of a short circuit between a bit line contact plug and a storage node contact plug.

Also, embodiments of the present invention include a method for manufacturing a semiconductor device which can improve the characteristics and the reliability of a semiconductor device.

In one aspect of the present invention, a method for manufacturing a semiconductor device comprises the steps of forming a plug over a semiconductor substrate; forming an insulation layer over the semiconductor substrate which is formed with the plug; defining a line type trench by primarily etching a partial thickness of the insulation layer; and defining a contact hole by secondarily etching a portion of the insulation layer, which is placed on the plug and formed a bottom of the trench, to expose the plug.

The plug comprises a landing plug.

The insulation layer is formed to have a stack structure which includes an etch stop layer.

The trench is a trench for a bit line.

The step of defining the contact hole comprises the steps of forming spacers on sidewalls of the trench; and secondarily etching the portion of the insulation layer, which is placed on the plug and formed the bottom of the trench, using the spacers as an etch mask.

The spacers comprise a nitride layer.

The contact hole is a contact hole for a bit line contact plug.

After the step of defining the contact hole, the method further comprises the steps of forming a barrier layer on surfaces of the contact hole and trench; forming a first conductive layer on the barrier layer to fill the contact hole and the trench; forming a bit line contact plug in the contact hole by removing portions of the first conductive layer and barrier layer which are formed in the trench; and forming a bit line in the trench by forming a second conductive layer on the bit line contact plug.

After the step of defining the contact hole, the method further comprises the steps of forming a barrier layer on surfaces of the contact hole and trench; and forming a bit line contact plug in the contact hole and a bit line in the trench by forming a conductive layer on the barrier layer to fill the contact hole and the trench.

In another aspect of the present invention, a method for manufacturing a semiconductor device comprises the steps of delimiting active regions in a semiconductor substrate; forming a plurality of gate lines on the semiconductor substrate to extend in a first direction tilted with respect to the active regions; forming a plug on a portion of each active region which is placed between adjoining gate lines; forming an insulation layer on the semiconductor substrate which is formed with the plug; defining a line type trench by primarily etching a partial thickness of the insulation layer, to extend in a second direction perpendicular to the first direction; and defining a contact hole by secondarily etching a portion of the insulation layer, which is placed on the plug and formed a bottom of the trench, to expose the plug.

The plug comprises a landing plug.

The insulation layer is formed to have a stack structure which includes an etch stop layer.

The trench is a trench for a bit line.

The step of defining the contact hole comprises the steps of forming spacers on sidewalls of the trench; and secondarily etching the portion of the insulation layer, which is placed on the plug and formed the bottom of the trench, using the spacers as an etch mask.

The spacers comprise a nitride layer.

The contact hole is a contact hole for a bit line contact plug.

After the step of defining the contact hole, the method further comprises the steps of forming a barrier layer on surfaces of the contact hole and trench; forming a first conductive layer on the barrier layer to fill the contact hole and the trench; forming a bit line contact plug in the contact hole by removing portions of the first conductive layer and barrier layer which are formed in the trench; and forming a bit line in the trench by forming a second conductive layer on the bit line contact plug, to extend in the second direction perpendicular to the gate lines.

After the step of defining the contact hole, the method further comprises the steps of forming a barrier layer on surfaces of the contact hole and trench; and forming a bit line contact plug in the contact hole and a bit line in the trench to extend in the second direction perpendicular to the gate lines, by forming a conductive layer on the barrier layer to fill the contact hole and the trench.

DESCRIPTION OF SPECIFIC EMBODIMENTS

In embodiments of the present invention, a trench for a bit line is defined, and subsequently spacers are formed on the sidewalls of the trench. Then, a contact hole for a bit line contact plug is defined by etching the bottom of the trench using the spacers as an etch mask. Through this, a contact hole for a bit line contact plug having a critical dimension (CD) smaller than that of the trench for a bit line can be defined. Therefore, in the present invention, it is possible to form a bit line capable of sufficiently covering a bit line contact plug without increasing the width of the bit line. As a consequence, in the present invention, the occurrence of a short circuit between the bit line contact plug and storage node contact plugs is prevented, and therefore, the characteristics and the reliability of a semiconductor device are improved.

Hereafter, specific embodiments of the present invention will be described in detail with reference to the accompanying drawings.

Figure 1:
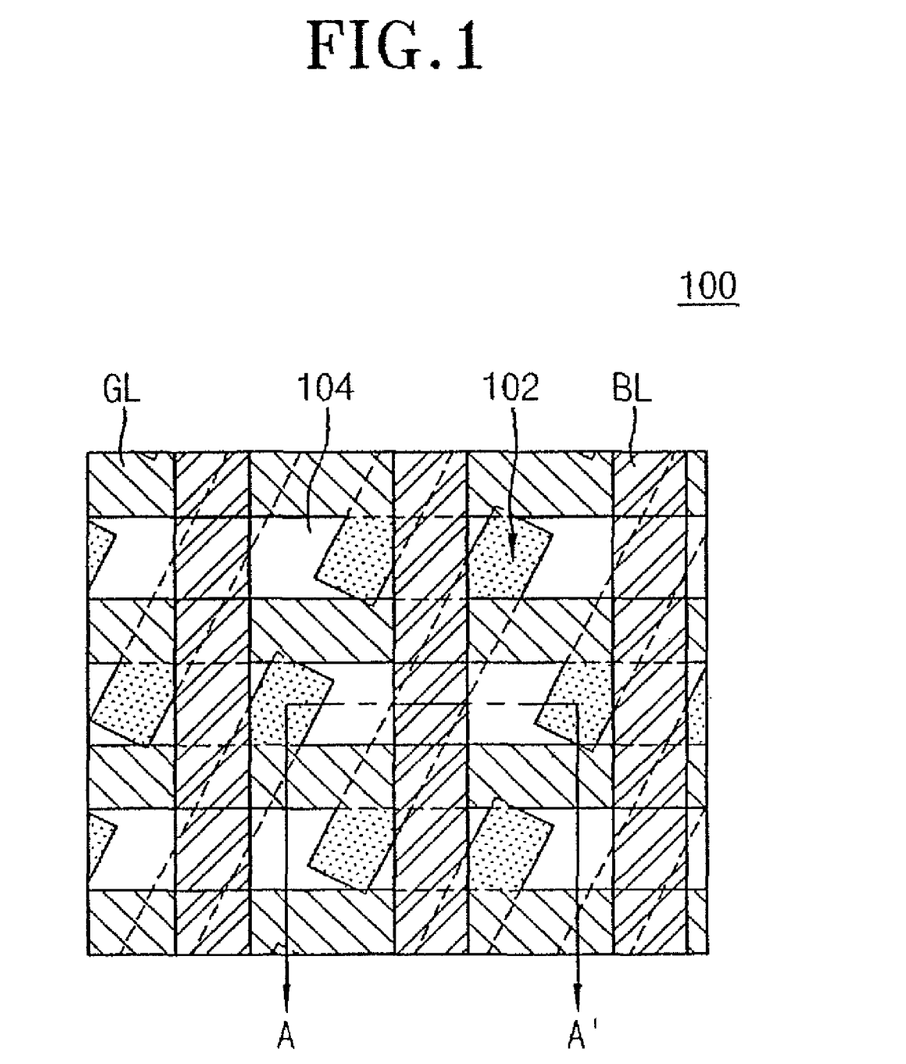
FIG. 1 is a plan view showing a semiconductor device according to the present invention.

FIG. 1 is a plan view showing a semiconductor device according to the present invention, and FIGS. 2A through 2J are cross-sectional views taken in correspondence to the line A-A' of FIG. 1, shown for illustrating the processes of a method for manufacturing a semiconductor device in accordance with a first embodiment of the present invention.

Figure 2A:
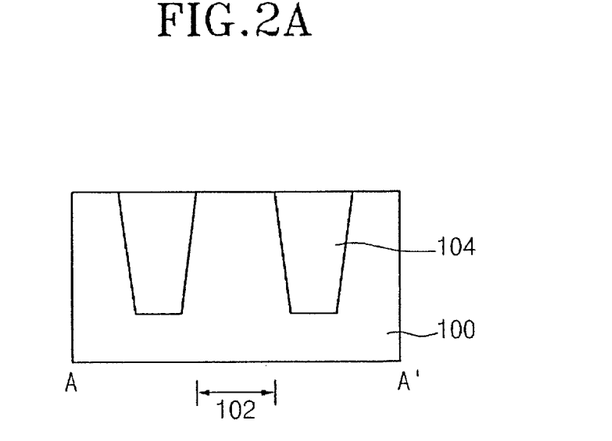
FIGS. 2A through 2J are cross-sectional views taken in correspondence to the line A-A' of FIG. 1, shown for illustrating the processes of a method for manufacturing a semiconductor device in accordance with a first embodiment of the present invention.

Referring to FIG. 2A, an isolation structure 104 is formed in a semiconductor substrate 100 in such a way as to delimit active regions 102. Then, a plurality of gate lines GL (see FIG. 1) are formed on the semiconductor substrate 100, including the active regions 102 and the isolation structure 104. The plurality of gate lines GL are formed so as to extend in a first direction tilted with respect to the active regions 102.

Figure 2B:
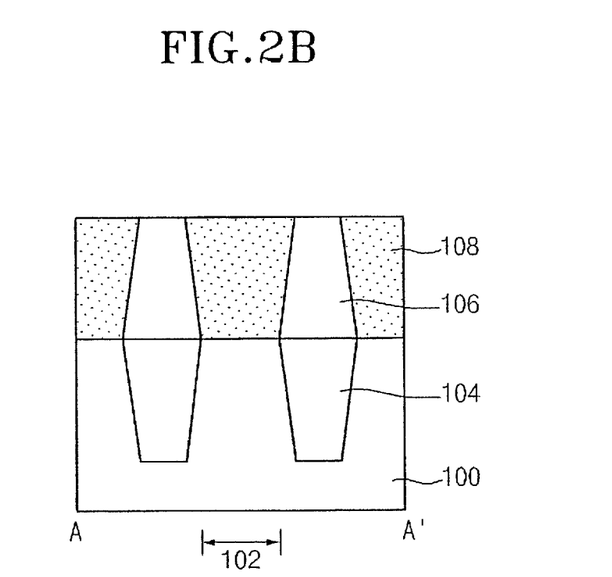

Referring to FIG. 2B, an interlayer dielectric 106 is formed on the semiconductor substrate 100, which is formed with the gate lines GL, in such a way as to fill the spaces between the gate lines GL. Subsequently, the interlayer dielectric 106 is etched in such a way as to expose portions of the active regions 102 positioned between the gate lines GL, and plugs, for example, landing plugs 108, are formed on the exposed portions of the active regions 102 between the gate lines GL.

Figure 2C:
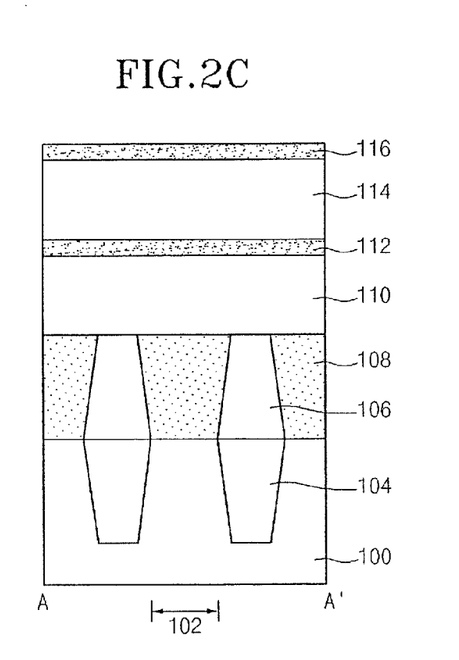

Referring to FIG. 2C, a first insulation layer 110 and a second insulation layers 114 are formed on the resultant semiconductor substrate 100, which is formed with the landing plugs 108. The first and second insulation layers 110 and 114 are formed to have a stack structure including an etch stop layer 112 interposed between the first and second insulation layers 110 and 114. According to an embodiment of the present invention, the first and second insulation layers 110 and 114 comprise oxide layers, and the etch stop layer 112 comprises a nitride layer, however it is to be understood that the above is by way of example and the present invention is not limited in this way. A hard mask layer 116 comprising a nitride layer is formed on the second insulation layer 114.

Figure 2D:
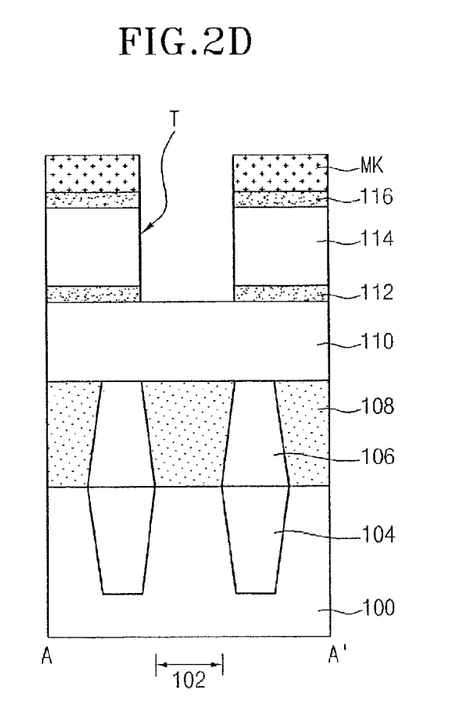

Referring to FIG. 2D, a mask pattern MK is formed on the hard mask layer 116 so as to expose a bit line forming region. A trench T for a bit line is defined in the resulting structure by primarily etching (i.e., conducting a first etching) the hard mask layer 116, the second insulation layer 114, and the etch stop layer 112 using the mask pattern MK as an etch mask.

Figure 3A:
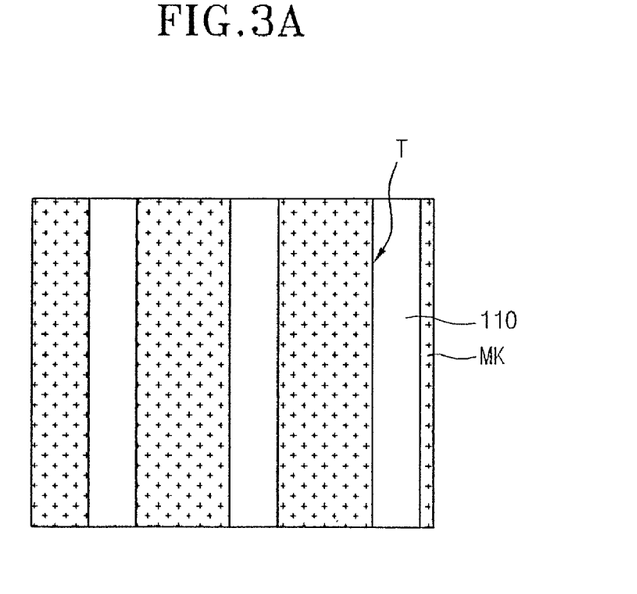
FIG. 3A is a plan view corresponding to FIG. 2D, shown for illustrating the method for manufacturing a semiconductor device in accordance with the first embodiment of the present invention.

FIG. 3A is a plan view corresponding to FIG. 2D, shown for illustrating the method for manufacturing a semiconductor device in accordance with the first embodiment of the present invention. Referring to FIG. 3A, the trench T for a bit line is defined having a line shape which extends in a second direction perpendicular to the first direction of the gate lines GL.

Figure 2E:
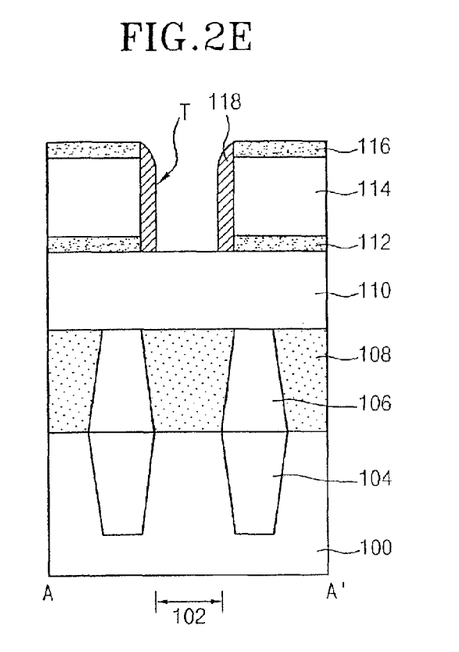

Referring to FIG. 2E, the mask pattern MK is removed, and subsequently, a layer for spacers, for example, a nitride layer is formed on the surface of the trench T and on the hard mask layer 116. Next, by anisotropically etching the layer for spacers, spacers 118 are formed on the sidewalls of the trench T.

Figure 2F:
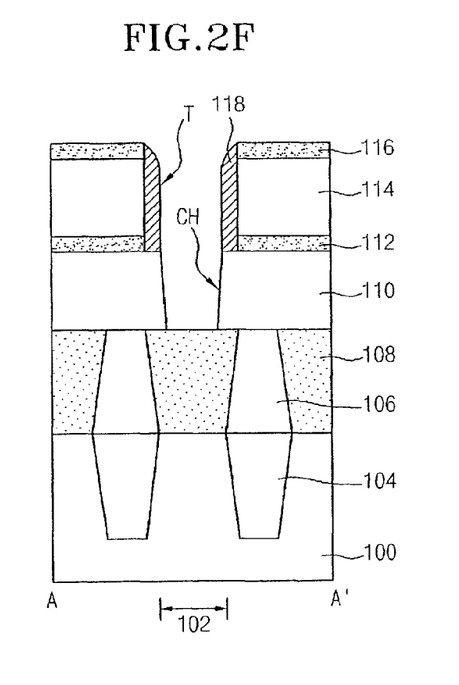

Referring to FIG. 2F, using the spacers 118 as an etch mask a portion of the first insulation layer 110 corresponding to a bit line contact plug forming region at the bottom of the trench T over the landing plug is etched through a secondary etching so as to define a contact hole CH for a bit line contact plug and expose the landing plug 108. Preferably, a photoresist pattern (not shown) is formed on the hard mask layer 116 in such a way as to expose the bit line contact plug forming region so as to define the contact hole CH. It is possible to form the photoresist pattern which has a lager CD than that of the contact hole CH. Therefore, in the present invention, while forming the contact hole CH, a photo margin is improved.

Figure 3B:
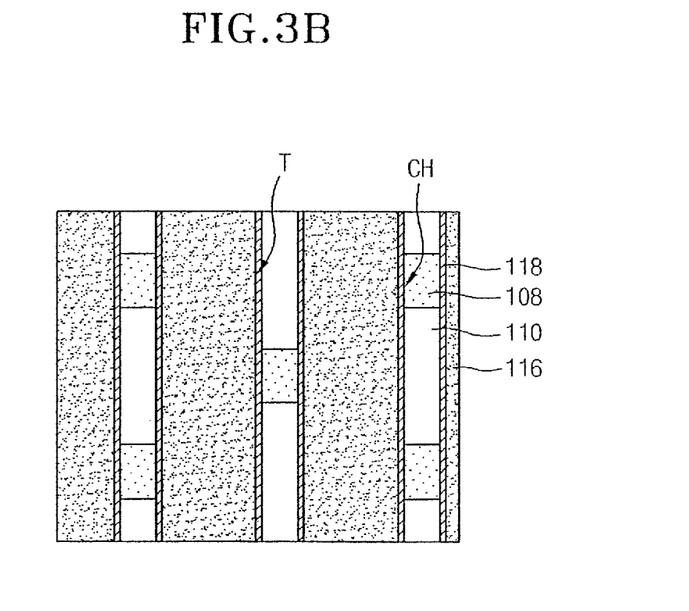
FIG. 3B is a plan view corresponding to FIG. 2F, shown for illustrating the method for manufacturing a semiconductor device in accordance with the first embodiment of the present invention.

FIG. 3B is a plan view corresponding to FIG. 2F, shown for illustrating the method for manufacturing a semiconductor device in accordance with the first embodiment of the present invention. Referring to FIG. 3B, the contact hole CH is defined to have a CD smaller than that of the trench T, because the width of the contact hole is defined using the spacers 118 as an etch mask.

Figure 2G:
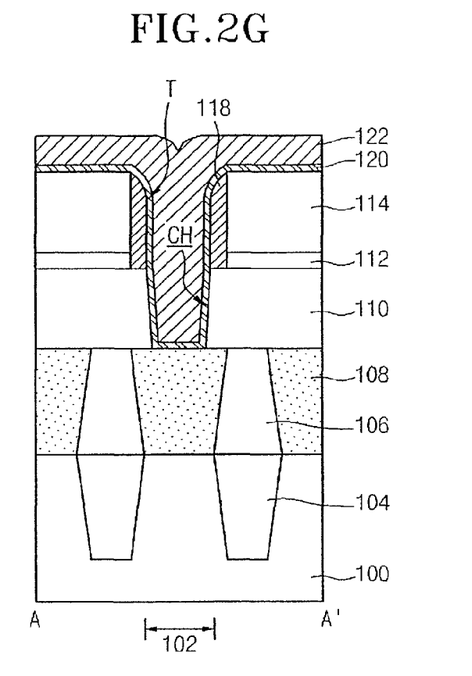

As shown in FIG. 2G, the hard mask layer 116 is removed, and a barrier layer 120 is formed on surfaces of the spacers 118 and the first insulation layer 110, in which the contact hole CH and trench T are defined, and on the second insulation layer 114. According to an embodiment of the present invention, the barrier layer 120 comprises a metal-based layer, although this is by way of example, and the present invention is not limited in this way. A first conductive layer 122 is formed on the barrier layer 120 in such a way as to fill the contact hole CH and the trench T. According to an embodiment of the present invention, the first conductive layer 122 comprises a metal layer formed of tungsten, however this is by way of example only and the present invention is not limited in this way.

Figure 2H:
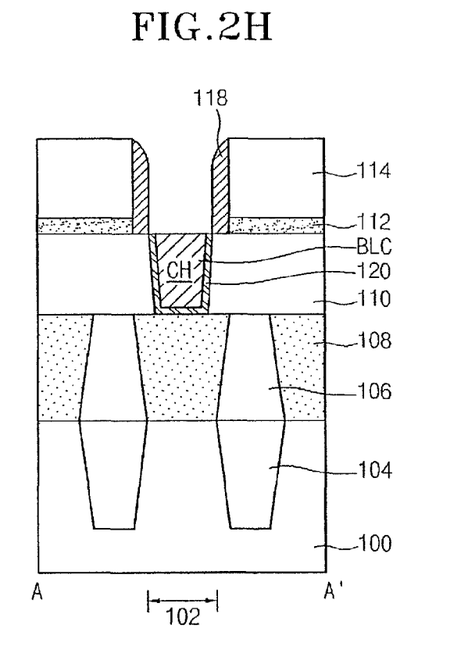

Referring to FIG. 2H, portions of the first conductive layer 122 and barrier layer 120 formed in the trench T are removed through a primary etch-back process. As a result, a bit line contact plug BLC is formed in the contact hole CH with the barrier layer 120 placed between the bit line contact plug BLC and the first insulation layer 110.

Figure 2I:
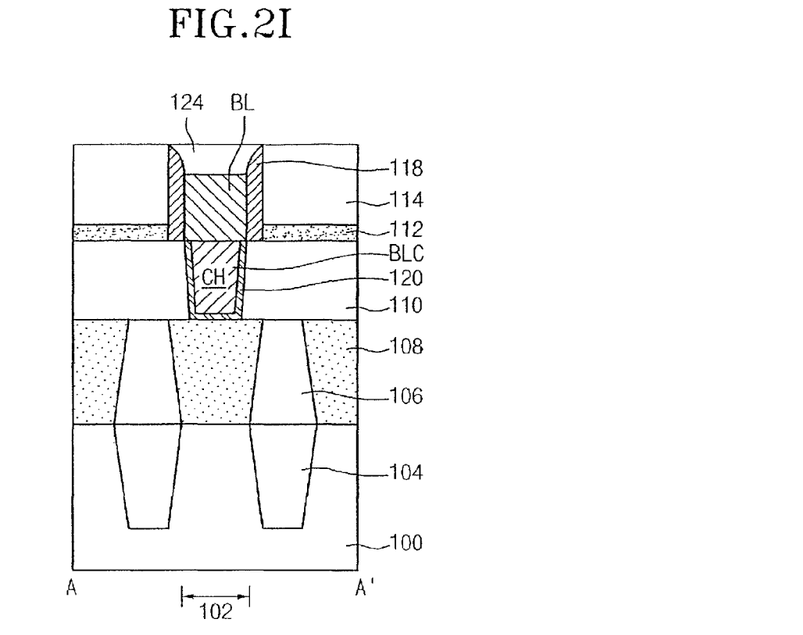

Referring to FIG. 2I, a second conductive layer is formed on the barrier layer 120 and the bit line contact plug BLC, and a partial thickness of the second conductive layer is removed by conducting a secondary etch-back so as to form a bit line BL in the trench T, such that the bit line BL extends in the second direction perpendicular to the first direction of the gate lines GL. The bit line BL is formed without the barrier layer 120. Thereupon, a bit line hard mask layer 124 is formed on the bit line BL to fill the trench T, and preferably, after forming the bit line hard mask layer 124, the surface of the bit line hard mask layer 124 is planarized until the second insulation layer 114 is exposed.

Figure 2J:
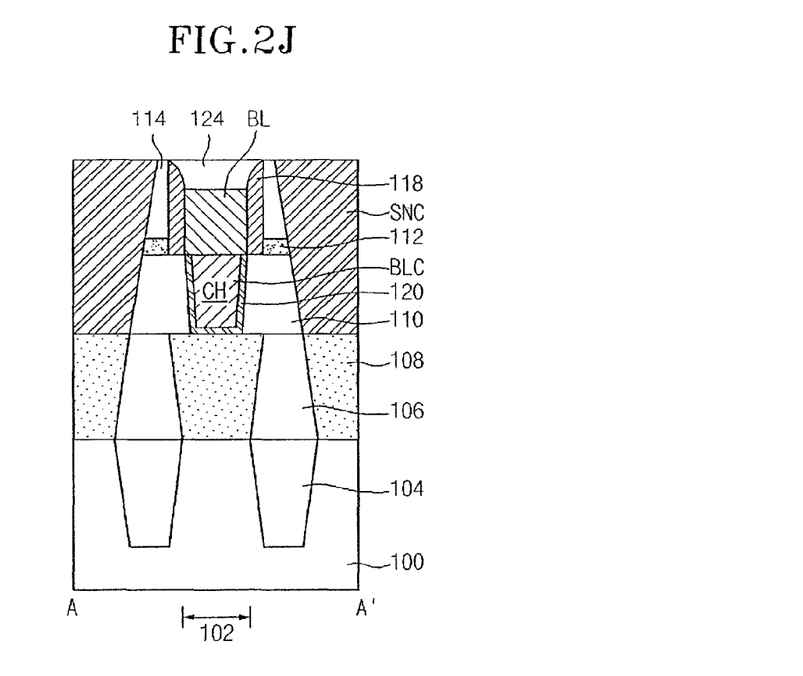

Referring to FIG. 2J, portions of the second insulation layer 114, etch stop layer 112, and first insulation layer 110 are etched to form contact holes that expose the landing plugs 108, and storage node contact plugs SNC are formed in the contact holes.

Thereafter, while not shown in detail, by sequentially conducting a series of well-known subsequent processes, the manufacture of a semiconductor device according to the first embodiment of the present invention is completed.

As is apparent from the above description, in the first embodiment of the present invention, after first defining a trench for a bit line, spacers are formed on the sidewalls of the trench, and then, by etching the bottom of the trench using the spacers as an etch mask, a contact hole for a bit line contact plug is defined.

As a result, in the present invention, it is possible to define a contact hole for a bit line contact plug which has a smaller CD than that of the trench for a bit line. Therefore, in the present invention, it is possible to form a bit line capable of sufficiently covering a bit line contact plug without increasing the width of the bit line on the bit line contact plug. Accordingly, in the present invention, the occurrence of a short circuit between the bit line contact plug and storage node contact plugs can be prevented without undergoing difficulties in conducting an etching process for selectively increasing the width of the bit line.

In the conventional art, since bit lines are first formed and then an insulation layer is formed to fill the spaces between the bit lines, the insulation layer must comprise a flowable insulation layer having excellent gap-fill characteristics, for example, an spin-on-dielectric (SOD) insulation layer. However, in the embodiment of the present invention, since a trench is defined by etching an insulation layer and a bit line is formed by depositing a metal layer in the trench, the insulation layer does not necessarily comprise a flowable insulation layer. Therefore, even if the insulation layer is exposed due to misalignment occurring while subsequently forming a metal line, in the present invention, because the insulation layer need not comprise an SOD insulation layer but can comprise a various different types of insulation layer, according to the present invention, it is possible to prevent imperfections that may occur due to gases or fumes being produced in the SOD insulation layer.

In the first embodiment described above, the primary and secondary etch-back processes are conducted such that the bit line contact plug is formed with the barrier layer disposed between the bit line contact plug and the first insulation layer and the bit line is formed without the barrier layer so as to decrease the resistance of the bit line. Alternatively, according to another embodiment of the present invention, to simplify the manufacturing process, only a single etch-back process can be conducted such that both the bit line and the bit line contact plug are formed by the medium of the barrier layer.

FIGS. 4A through 4D are cross-sectional views taken in correspondence to the line A-A' of FIG. 1, shown for illustrating the processes of a method for manufacturing a semiconductor device in accordance with a second embodiment of the present invention.

Figure 4A:
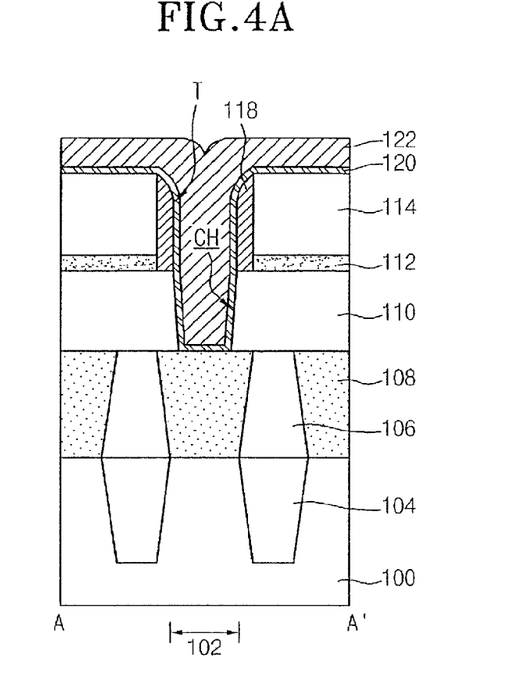
FIGS. 4A through 4D are cross-sectional views taken in correspondence to the line A-A' of FIG. 1, shown for illustrating the processes of a method for manufacturing a semiconductor device in accordance with a second embodiment of the present invention.

A trench and a contact hole are defined by conducting the processes of FIGS. 2A through 2F in the same way as the aforementioned first embodiment of the present invention, and then, as shown in FIG. 4A, a barrier layer 120 is formed on the surfaces of the first insulation layer 110 and the spacers 118, which define the contact hole CH and the trench T, and on the second insulation layer 114. The barrier layer 120 comprises, for example, a metal-based layer. A first conductive layer 122 is formed on the barrier layer 120 so as to fill the contact hole CH and the trench T. The first conductive layer 122 comprises, for example, a metal layer formed of tungsten.

Figure 4B:
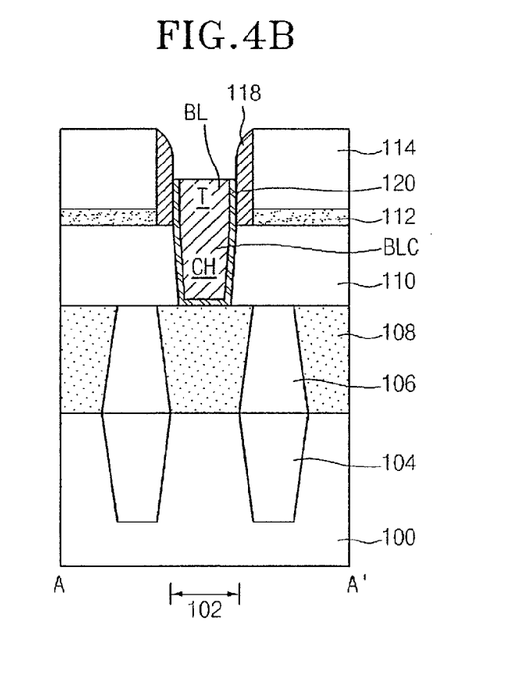

Referring to FIG. 4B, portions of the first conductive layer 122 and barrier layer 120 formed in an upper portion of the trench T are removed by conducting an etch back process. According to an embodiment as shown in FIG. 4B, the etch back process only removes a partial depth of the barrier layer 120 and the first conductive layer 122 formed in the trench T. As a result, a bit line contact plug BLC is formed in the contact hole CH with the barrier layer 120 placed between the bit line contact plug BLC and the first insulation layer 110, and a bit line BL is formed with the barrier layer 120 placed between the bit line BL and the spacers 118, such that the bit line extends in the second direction perpendicular to the first direction of the gate lines GL.

Figure 4C:
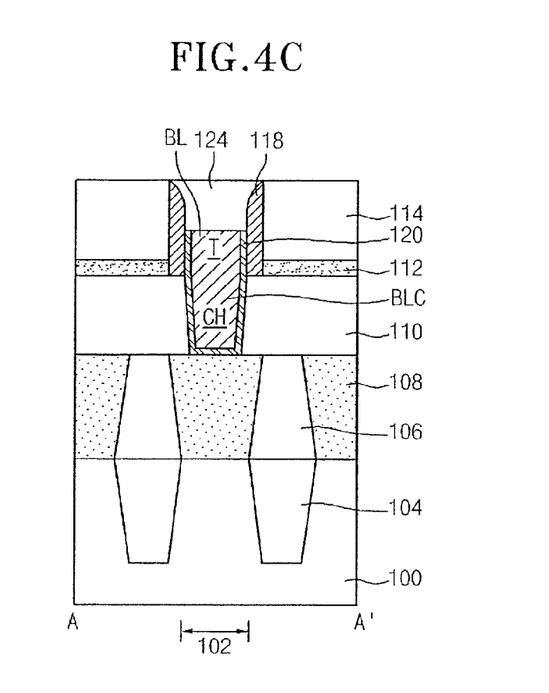

Referring to FIG. 4C, a bit line hard mask layer 124 is formed on the barrier layer 120 and the bit line BL to fill the trench T, and then the surface of the bit line hard mask layer 124 is preferably planarized until the second insulation layer 114 is exposed.

Figure 4D:
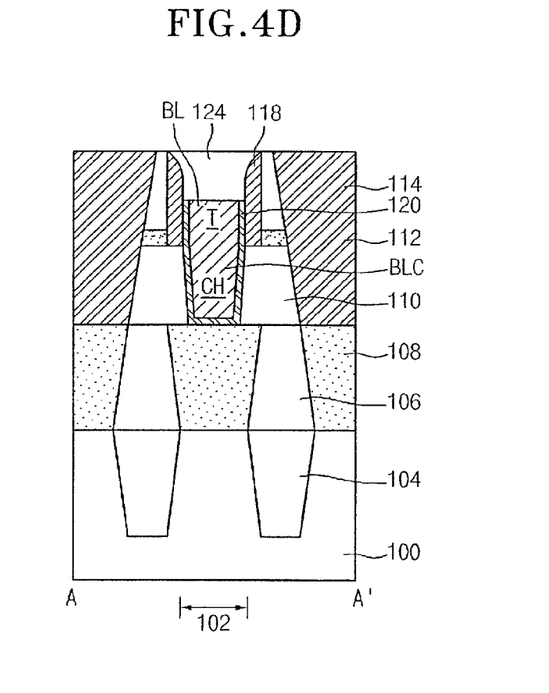

Referring to FIG. 4D, portions of the second insulation layer 114, etch stop layer 112, and first insulation layer 110 are etched to form contact holes which expose the landing plugs 108, and then storage node contact plugs SNC are formed in the contact holes.

Thereafter, while not shown in detail, by sequentially conducting a series of well-known subsequent processes, the manufacture of a semiconductor device according to the second embodiment of the present invention is completed.

Meanwhile, although not shown in detail, it is to be understood that, when forming the bit line contact plugs and the bit lines according to embodiments of the present invention, bit line contact plugs and bit lines may be simultaneously formed in a peripheral region. Through this, it is can be appreciated that, after bit line contact plugs are first formed in a peripheral region, the bit line contact plugs and the bit lines according to embodiments of the present invention can be formed when forming bit lines in the peripheral region.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A method for manufacturing a semiconductor device, comprising:
    delimiting active regions in a semiconductor substrate;
    forming a plurality of gate lines on the semiconductor substrate, the gate lines extending in a first direction tilted with respect to the active regions;
    forming a plug between adjacent gate lines on a portion of each active region;
    forming an insulation layer on the semiconductor substrate having the plug formed thereon;
    conducting a first etching of the insulation layer to remove a partial thickness of the insulation layer so as to define a line type trench therein, wherein the line type trench is capable of receiving a bit line and extends in a second direction perpendicular to the first direction;
    conducting a second etching of a portion of the insulation layer corresponding to a bottom of the line type trench so as to define a contact hole exposing the plug, wherein the contact hole is capable of receiving a bit line contact plug, wherein conducting the second etching comprises:
    forming spacers on sidewalls of the trench; and
    conducting the second etching on the portion of the insulation layer corresponding to the bottom of the line type trench, using the spacers as an etch mask;
    after conducting the second etching, forming a barrier layer on surfaces of the contact hole and trench;
    forming a first conductive layer on the barrier layer to fill the contact hole and the trench;
    removing portions of the first conductive layer and the barrier layer formed in the trench so as to form a bit line contact plug in the contact hole; and
    forming a bit line in the trench by forming a second conductive layer on the bit line contact plug, the bit line extending in the second direction perpendicular to the gate lines.

2. The method according to claim 1, wherein the plug comprises a landing plug.

3. The method according to claim 1, wherein the insulation layer is formed to have a stack structure comprising an etch stop layer.

4. The method according to claim 1, wherein the spacers comprise a nitride layer.

5. The method according to claim 1, wherein the contact hole is defined to have a smaller critical dimension than that of the trench.

* * * * *